(12) United States Patent
Shoemaker

(10) Patent No.: US 9,490,003 B2
(45) Date of Patent: Nov. 8, 2016

(54) INDUCED THERMAL GRADIENTS

(75) Inventor: Kenneth D. Shoemaker, Los Altos Hills, CA (US)

(73) Assignee: Intel Corporation, Santa Clara, CA (US)

( * ) Notice: Subject to any disclaimer, the term of this patent is extended or adjusted under 35 U.S.C. 154(b) by 280 days.

(21) Appl. No.: 13/077,661

(22) Filed: Mar. 31, 2011

(65) Prior Publication Data
US 2012/0249218 A1  Oct. 4, 2012

(51) Int. Cl.
| | | |
|---|---|---|
| G01N 25/72 | (2006.01) | |
| G01K 7/00 | (2006.01) | |
| G06F 1/00 | (2006.01) | |
| G11C 7/00 | (2006.01) | |
| G01K 3/14 | (2006.01) | |
| G11C 11/406 | (2006.01) | |
| G01K 3/08 | (2006.01) | |
| G06F 1/20 | (2006.01) | |

(Continued)

(52) U.S. Cl.
CPC ......... *G11C 11/40626* (2013.01); *G01K 3/08* (2013.01); *G06F 1/206* (2013.01); *G06F 1/324* (2013.01); *G06F 1/3275* (2013.01); *G11C 7/04* (2013.01); *G11C 11/40615* (2013.01); *G11C 2211/4067* (2013.01); *H01L 2224/48091* (2013.01); *H01L 2224/48145* (2013.01); *Y02B 60/1217* (2013.01); *Y02B 60/1225* (2013.01); *Y02B 60/1228* (2013.01); *Y02B 60/1275* (2013.01)

(58) Field of Classification Search
CPC .......... G11C 11/406; G11C 11/40626; G11C 11/40618; G11C 11/4091; G11C 16/26; G11C 2211/4068; G11C 11/00; G01N 25/72; G01K 7/00

USPC .......... 374/170–172, 178, 138, 110–112, 29, 374/30, 4, 1, 166, 137; 702/130, 132–136, 702/99; 365/63, 211, 212; 257/48; 327/512, 327/513; 700/299, 300
See application file for complete search history.

(56) References Cited

U.S. PATENT DOCUMENTS

| | | | | |
|---|---|---|---|---|
| 5,502,838 | A | * | 3/1996 | Kikinis ..................... 713/501 |
| 5,902,044 | A | * | 5/1999 | Pricer ..................... G01K 3/14 374/112 |

(Continued)

FOREIGN PATENT DOCUMENTS

| | | |
|---|---|---|
| CN | 1751357 | 3/2006 |
| CN | 1828549 | 9/2006 |

(Continued)

OTHER PUBLICATIONS

Office Action for U.S. Appl. No. 13/336,806, mailed Jul. 28, 2014, 7 pages.

(Continued)

*Primary Examiner* — Gail Kaplan Verbitsky
(74) *Attorney, Agent, or Firm* — Blakely, Sokoloff, Taylor & Zafman LLP

(57) ABSTRACT

A temperature difference between a first thermal sensor and a second thermal sensor on a first die is determined. The temperature difference is transmitted from the first die to a circuit on a second die. A temperature from a thermal sensor on the second die is determined. The temperature difference and the temperature from the thermal sensor are utilized on the second die to modify operational characteristics of one or more circuits on the second die.

15 Claims, 4 Drawing Sheets

(51) Int. Cl.
    *G06F 1/32*     (2006.01)
    *G11C 7/04*     (2006.01)

(56) References Cited

U.S. PATENT DOCUMENTS

| | | | |
|---|---|---|---|
| 6,488,405 B1* | 12/2002 | Eppes | G01N 25/72 324/750.03 |
| 6,557,072 B2 | 4/2003 | Osborn | |
| 6,662,136 B2 | 12/2003 | Lamb et al. | |
| 6,908,227 B2* | 6/2005 | Rusu et al. | 374/141 |
| 7,260,007 B2* | 8/2007 | Jain et al. | 365/212 |
| 7,400,945 B2 | 7/2008 | Radhakrishnan | |
| 7,535,020 B2* | 5/2009 | Yoshida et al. | 257/48 |
| 7,549,795 B2* | 6/2009 | Kosta | G01K 7/01 374/170 |
| 7,590,020 B2 | 9/2009 | Lee | |
| 7,590,473 B2 | 9/2009 | Wyatt | |
| 7,621,671 B2* | 11/2009 | Petruzzi et al. | 374/170 |
| 7,775,710 B2* | 8/2010 | Mukherjee | 374/170 |
| 7,965,571 B2 | 6/2011 | Jeong et al. | |
| 7,984,250 B2 | 7/2011 | Steinbrecher et al. | |
| 8,096,705 B2* | 1/2012 | Sri-Jayantha | G06F 1/206 374/111 |
| 8,174,921 B2 | 5/2012 | Kim et al. | |
| 8,186,878 B2 | 5/2012 | Janzen et al. | |
| 8,192,082 B2* | 6/2012 | Song et al. | 374/170 |
| 8,425,115 B2* | 4/2013 | Rahman et al. | 374/185 |
| 8,590,332 B2 | 11/2013 | Wyatt | |
| 8,624,527 B1 | 1/2014 | Meir et al. | |
| 8,762,097 B2 | 6/2014 | Millet | |
| 8,892,269 B2 | 11/2014 | Shrall et al. | |
| 9,104,540 B2 | 8/2015 | Toronyi | |
| 9,182,800 B2* | 11/2015 | Trautman | G06F 1/3203 |
| 2001/0021217 A1* | 9/2001 | Gunther et al. | 374/178 |
| 2003/0158683 A1 | 8/2003 | Gauthier et al. | |
| 2004/0204899 A1 | 10/2004 | Gunther et al. | |
| 2005/0146965 A1* | 7/2005 | Kim et al. | 365/211 |
| 2005/0201174 A1 | 9/2005 | Klein | |
| 2006/0004537 A1 | 1/2006 | Jain et al. | |
| 2006/0007722 A1 | 1/2006 | Nordal et al. | |
| 2006/0221741 A1* | 10/2006 | Jain et al. | 365/211 |
| 2006/0242447 A1 | 10/2006 | Radhakrishnan et al. | |
| 2007/0045825 A1 | 3/2007 | Chan et al. | |
| 2007/0140315 A1 | 6/2007 | Janzen et al. | |
| 2007/0145578 A1* | 6/2007 | Lee | 257/723 |
| 2007/0191993 A1 | 8/2007 | Wyatt | |
| 2007/0271409 A1* | 11/2007 | Miura et al. | 711/5 |
| 2008/0007319 A1* | 1/2008 | Cox | 327/512 |
| 2008/0043556 A1 | 2/2008 | Nale | |
| 2008/0218192 A1* | 9/2008 | Johnson | 324/765 |
| 2008/0239852 A1 | 10/2008 | Jazayeri | |
| 2009/0141576 A1 | 6/2009 | Ruckerbauer | |
| 2009/0168840 A1 | 7/2009 | Song et al. | |
| 2010/0131724 A1* | 5/2010 | Miura et al. | 711/154 |
| 2010/0142291 A1* | 6/2010 | Joo et al. | 365/189.15 |
| 2010/0169585 A1 | 7/2010 | Steinbrecher et al. | |
| 2010/0214814 A1* | 8/2010 | Park et al. | 365/63 |
| 2011/0054717 A1 | 3/2011 | Yamauchi et al. | |
| 2011/0093132 A1 | 4/2011 | Tan et al. | |
| 2011/0193086 A1* | 8/2011 | Lee et al. | 257/48 |
| 2011/0194369 A1 | 8/2011 | Jeddeloh | |
| 2012/0163413 A1* | 6/2012 | Kim et al. | 374/152 |
| 2012/0297241 A1* | 11/2012 | Jeddeloh | 714/6.1 |
| 2013/0003781 A1 | 1/2013 | Pan | |
| 2013/0279276 A1 | 10/2013 | Schaefer | |
| 2013/0294184 A1 | 11/2013 | Yang et al. | |
| 2014/0092939 A1* | 4/2014 | Chang et al. | 374/178 |
| 2014/0122952 A1 | 5/2014 | Zimmerman | |
| 2014/0140156 A1 | 5/2014 | Shoemaker et al. | |
| 2014/0192583 A1* | 7/2014 | Rajan et al. | 365/63 |
| 2014/0237307 A1 | 8/2014 | Kobla et al. | |
| 2014/0371945 A1* | 12/2014 | Sato | G11C 11/40611 700/299 |
| 2015/0233964 A1* | 8/2015 | Tanabe | G01P 15/008 257/415 |

FOREIGN PATENT DOCUMENTS

| | | |
|---|---|---|
| CN | 1993765 | 7/2007 |
| CN | 101133459 | 2/2008 |
| JP | 2006108256 | 4/2006 |
| JP | 2008048384 | 2/2008 |
| KR | 20080091941 | 10/2008 |
| WO | WO2009/081225 | * 7/2009 |
| WO | WO-2009/081225 | 7/2009 |
| WO | WO-2009081225 | 7/2009 |

OTHER PUBLICATIONS

Notice of Preliminary Rejection for Korean Patent Application No. 10-2013-7025329 mailed Jul. 10, 2014, 10 pages.
Final Office Action for U.S. Appl. No. 13/336,806, mailed Jan. 9, 2014, 7 pages.
Office Action for U.S. Appl. No. 13/336,806, mailed Jun. 28, 2013, 8 pages.
Extended European Search Report for European Patent Application No. 12763926.8 mailed Nov. 10, 2014, 8 pages.
Office Action & Search Report for Taiwan Patent Application No. 101104389 mailed Jun. 12, 2014, 16 pages.
International Search Report and Written Opinion for PCT/US2012/024340 mailed Sep. 7, 2012, 9 pages.
International Preliminary Report on Patentability for PCT/US2012/024340 mailed Oct. 10, 2013, 6 pages.
Notice of Allowance for U.S. Appl. No. 13/336,806, mailed Apr. 2, 2015, 5 pages.
International Preliminary Report on Patentability from PCT/US2011/067284 mailed Jul. 3, 2014, 6 pgs.
Notice of Allowance from U.S. Appl. No. 13/997,975 mailed Jun. 10, 2015, 3 pgs.
International Search Report and Written Opinion of the International Searching Authority dated Sep. 17, 2012, in International Patent Application No. PCT/US2011/067284, 7 pages.
Notice of Allowance mailed Apr. 1, 2015, in U.S. Appl. No. 13/997,975, 9 pages.
Office Action dated Mar. 12, 2015 and Search Report in Taiwan Patent Application No. 101147195, 15 pages.
Office Action mailed Jan. 23, 2015, in U.S. Appl. No. 13/997,975, 6 pages.
Notice of Allowance mailed Nov. 19, 2015, in U.S. Appl. No. 13/997,975, 10 pages.
Ex Parte Quayle Action for U.S. Appl. No. 13/336,806, mailed Jan. 5, 2015, 4 pages.
Office Action & Search Report for Taiwan Patent Application No. 101104389 mailed Dec. 8, 2014, 20 pages.
Notice of Last Preliminary Rejection for Korean Patent Application No. 10-2013-7025329 mailed Jan. 27, 2015, 10 pages.
First Office Action dated Aug. 4, 2015 (+ English summary), in Chinese Patent Application No. 201280016742.2, 15 pages.
Notice of Final Rejection dated Jul. 30, 2015 (+ English translation), in Korean Patent Application No. 10-2013-7025329, 7 pages.
Second Office Action dated Aug. 18, 2015 (+ English translation), in Taiwanese Patent Application No. 101104389, 4 pages.
First Office Action (+ English Translation), Chinese Application No. 201180076442.9 mailed on Mar. 1, 2016, 40 pages.
Allowance Decision for Taiwanese Application No. 101104389 mailed on Feb. 16, 2016, 2 pages.
First Office Action and Search Report received (+ English Translation) for Taiwanese Application No. 104137715, mailed on Apr. 7, 2016, 6 pages.
English Translation of Non-Final Preliminary Rejection mailed Jan. 28, 2016, in Korean Patent Application No. 10-2015-7031435, 9 pages.
Extended European Search Report completed Jan. 21, 2016, in European Patent Application No. 15 18 7070, 9 pages.
Notice of Publication mailed on Feb. 17, 2016, European Application No. 15187070.6-1959/2996014, 2 pages.
Second European Office Action mailed on Jan. 27, 2016, European Application No. 12763926.8, 6 pages.
Notice of Allowance in U.S. Appl. No. 13/997,975, mailed on Mar. 17, 2016, 6 pages.

* cited by examiner

INDUCED THERMAL GRADIENTS

TECHNICAL FIELD

Embodiments of the invention relate to semiconductor devices. More particularly, embodiments of the invention relate to techniques for tolerating induced thermal gradients in semiconductor devices.

BACKGROUND

Semiconductor devices produce thermal energy when operating. Because the thermal energy may not be uniform, a thermal gradient may exist. As systems become smaller and semiconductor devices are more closely packed, which may result in mechanical coupling between devices. This tight mechanical coupling may result in unexpected induced thermal gradients between one and another of the semiconductor devices.

These unexpected thermal gradients may result in operating errors. For example, in a dynamic random access memory (DRAM), unexpected thermal gradients may result in inappropriate refresh frequencies and even data loss.

BRIEF DESCRIPTION OF THE DRAWINGS

Embodiments of the invention are illustrated by way of example, and not by way of limitation, in the figures of the accompanying drawings in which like reference numerals refer to similar elements.

DETAILED DESCRIPTION

In the following description, numerous specific details are set forth. However, embodiments of the invention may be practiced without these specific details. In other instances, well-known circuits, structures and techniques have not been shown in detail in order not to obscure the understanding of this description.

When a processor (or System on a Chip, SoC) and DRAM dies are stacked there may be little thermal gradient between the DRAM and the logic chip. Logic chips typically contain several thermal sensors that are used to monitor the temperature on various parts of the logic chip and are typically placed where localized hot spots are expected. Logic chips may exhibit high thermal gradients across the die corresponding to more and less active regions in the logic chip.

DRAM chips may exhibit variable retention times based on temperature. Lower-power DRAM chips may use this property in a feature called "temperature compensated self refresh." This may reduce the refresh frequency during self refresh thereby reducing standby power consumption at lower temperatures. Typically a DRAM chip has a single thermal sensor because DRAM chips typically have a relatively uniform power distribution. However, when closely coupled with a logic chip that has a non-uniform power distribution, the DRAM thermal sensor may not be located near the hottest spot of the DRAM chip. This may cause the DRAM to refresh at an inappropriately low rate, which may lead to data loss.

The techniques described herein address this problem by one or more strategies. In one embodiment, the location of a thermal sensor may be standardized for all devices on a stack. The location may be specified, for example, as a certain offset from a standardized vertical interconnect array in an area that cannot be used for the memory array in the DRAM. In one embodiment, a SoC (or other computational element) may calculate a temperature difference between a hottest spot and the standard location. In one embodiment, a mode register may be utilized by the SoC (or other computational element) to communicate with the DRAM regarding the temperature difference between the standard location and the hot spot. The DRAM can then utilize this difference to set refresh rates accordingly.

In alternate embodiments, the techniques may be adapted to function without a standard thermal sensor location. In these embodiments, the SoC (or other computational element) may calculate a maximum temperature gradient across its die and use that information to program the DRAM offset temperature. This may allow the DRAM to refresh its contents more often than absolutely necessary, which may lead to increased power consumption, but would prevent data loss.

Figure 1:
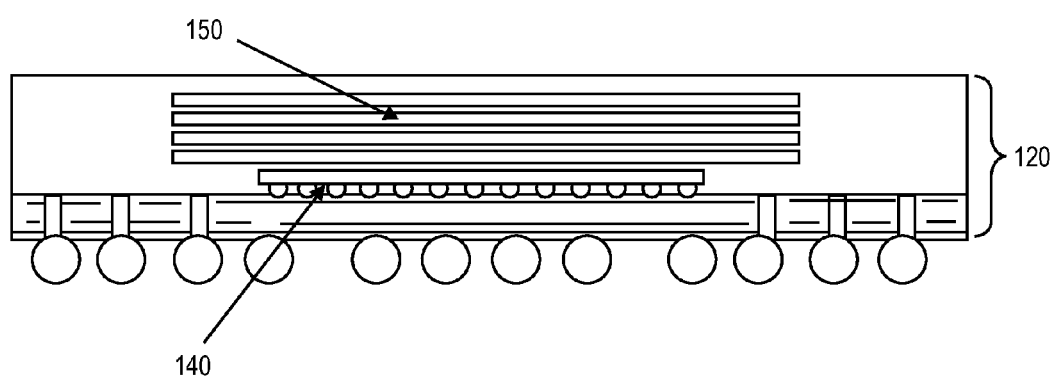
FIG. 1 is a block diagram of one embodiment of a package having one or more memory dies stacked with a processor/logic die.

FIG. 1 is a block diagram of one embodiment of a package having one or more memory dies stacked with a processor/logic die. In the example of FIG. 1, several dies containing memory arrays (e.g., DRAM) are illustrated; however any number of memory dies may be supported.

Integrated circuit package 120 may be any type of package known in the art with any type of interface known in the art (e.g., ball grid array, etc.). Within package 120, logic die 140 may be electrically coupled to the interface. One or more memory modules 150 may be electrically coupled with logic die 140. Logic die 140 may be, for example, a processor die, a system on a chip (SoC) die, or any other die that may have uneven thermal patterns.

One or more memory modules 150 may also be physically connected to logic die 140, which my have thermal consequences for one or more of the dice. Because logic die 140 may have an uneven thermal gradient the physical connection between logic die 140 and one or more of memory modules 150, the thermal gradient of one or more of memory modules 150 may not be as expected. Typically, memory modules, for example DRAMs, have a relatively consistent temperature across the die because circuit utilization on the memory module is relatively distributed.

Because of this, the placement of a thermal sensor on the memory module die may be relatively unimportant. That is, when the memory module is operating without any outside thermal influences, a single thermal sensor may be sufficient and the location of thermal sensor may be relatively flexible.

In contrast to memory modules, logic dice have circuits that are used consistently and frequently which result in higher operating temperatures in those regions. Therefore, logic dice typically have thermal sensors located a places of higher expected temperature so that these hot spots may be monitored. When a logic die comes in to physical contact with another die, for example, memory die 150, the hot spots on the logic die may create corresponding hot spots on the memory die. Thus, the thermal information from the memory die thermal sensor may be inaccurate.

In one embodiment, memory die 150 has a thermal sensor in a known location. That is, each memory die may have the same thermal sensor location. Logic die 140 may have a corresponding thermal sensor in a location that is immediately adjacent to or substantially adjacent to the thermal sensor of memory die 150. Logic die 140 may also have thermal sensors in other locations, for example, corresponding to one or more hot spots.

In one embodiment, logic die may determine a temperature difference between a thermal sensor at a hot spot and a thermal sensor corresponding to a thermal sensor in the memory module. The temperature difference between the thermal sensors on the logic die may be used by the memory module to determine an adjustment to the temperature indicated by the thermal sensor on the memory module. The behavior of the memory module may be modified based on the adjusted temperature rather than the measured temperature.

Figure 2:
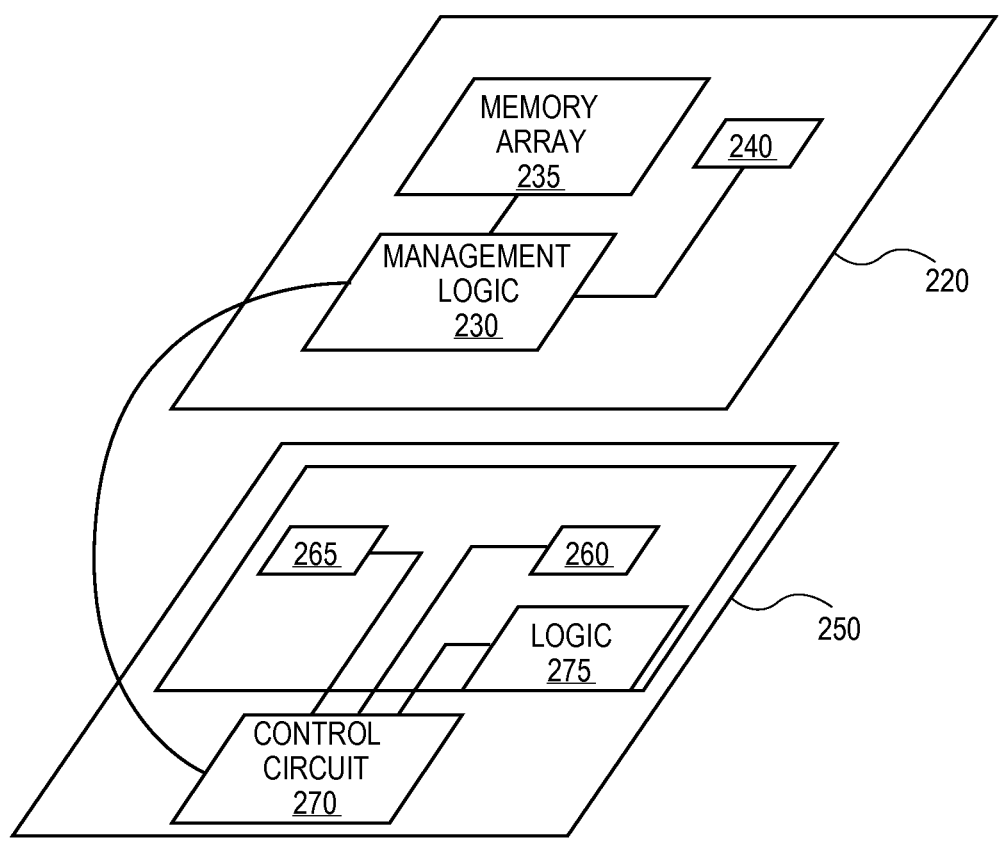
FIG. 2 is a block diagram of one embodiment of a first die having a single sensor and a second die having multiple sensors.

FIG. 2 is a block diagram of one embodiment of a first die having a single sensor and a second die having multiple sensors. The example of FIG. 2 illustrates two dice that may be stacked so that the heat from one die may transfer to the other die. The example of FIG. 2 illustrates only two dice, but the concepts illustrated are applicable to any number of stacked dice.

Die 220 may include any type of circuitry, for example, DRAM arrays, or other memory structures 235. Die 220 includes thermal sensor 240 coupled with management logic 230. In one embodiment, when die 220 includes DRAM, management logic 230 may operate to read temperature information from thermal sensor 240 and may use that temperature information to modify behavior or operation of memory array 235. In one embodiment, the refresh rate of memory array 235 may be adjusted by management logic 230 based on information from thermal sensor 240.

Die 250 may include logic circuitry, for example, a processor core, a graphics processor, a system on a chip (SoC), or other logic 275. Die 250 may have multiple types of circuits, for example, a processor core, a cache memory, a transceiver, etc. Because die 250 may have circuits with irregular thermal gradients, die 250 may have multiple thermal sensors (e.g., 260, 265), one of which is to be aligned with thermal sensor 240.

In one embodiment, thermal sensor 240 may be placed in a predetermined location on die 220 that is known to designers and/or manufacturers of die 250. Thermal sensor 260 is positioned so that when die 220 is stacked on die 250, thermal sensors 240 and 260 will be aligned or close enough spatially that temperature information from thermal sensor 260 may be utilized with temperature information from thermal sensor 240.

Control circuit 270 is coupled with thermal sensors 260 and 265 to collect temperature information. In one embodiment, control circuit 270 determines a temperature difference between thermal sensor 265 and thermal sensor 260. Control circuit 270 may transmit this difference (or information indicating a difference range), to management logic 230. In one embodiment, a bit in a register in management logic 230 is set to indicate a temperature difference (e.g., 0 indicates 0-10 degree difference, 1 indicates a 10+ degree difference). In another embodiment, more bits may be used to provide a more granular range, or an actual temperature difference may be transmitted.

Management logic 230 uses the temperature difference information from control circuit 270 with temperature information from thermal sensor 240 to manage operation of memory array 235. In one embodiment, management logic 230 controls a refresh rate for memory array 235. Management logic 230 may combine the temperature difference information with the temperature information from thermal sensor 240 to determine an operational temperature value that is used for management of memory array 235. For example, if the temperature difference indicates a higher temperature, management logic 230 may increase the refresh rate for memory array 235.

Figure 3:
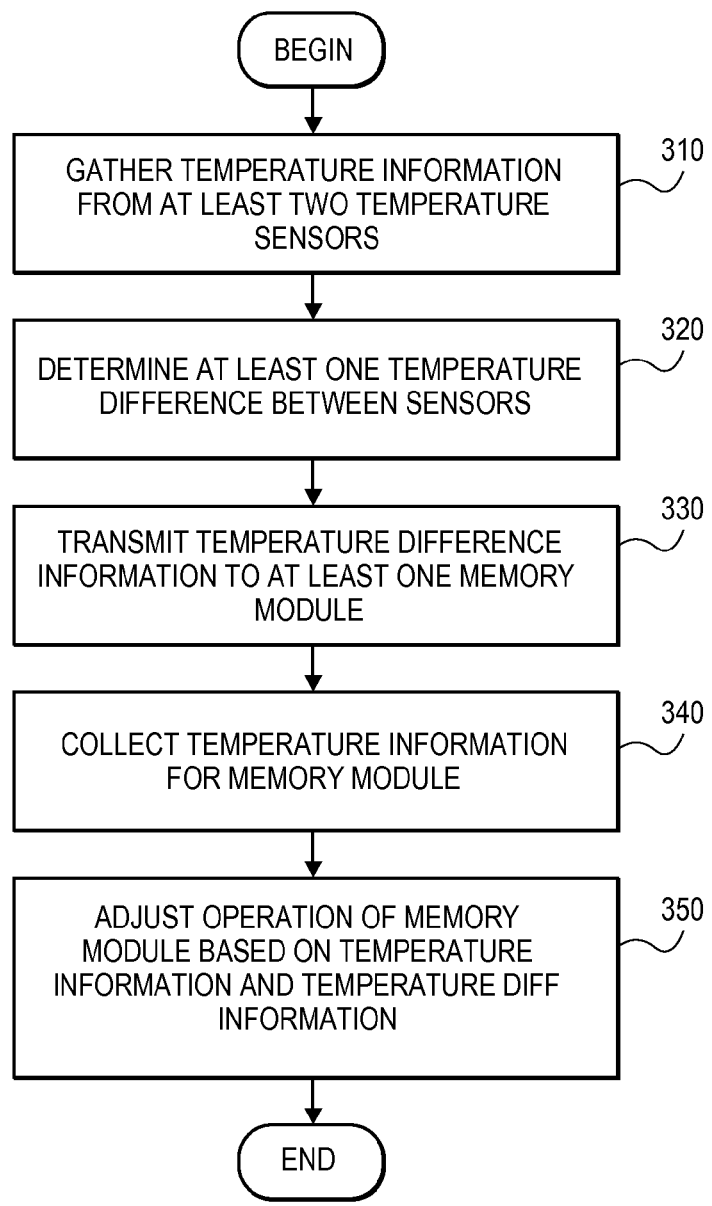
FIG. 3 is a flow diagram of one embodiment of a technique to operate a memory array using temperature difference information.

FIG. 3 is a flow diagram of one embodiment of a technique to operate a memory array using temperature difference information. The operations described with respect to FIG. 3 may be performed by control and/or management circuitry spread across one or more dice.

The operation of FIG. 3 is applicable to a configuration of multiple dice that are physically in contact with one another so that thermal transfer may occur. In one embodiment, at least one thermal sensor on the lower die is aligned with at least one sensor on the upper die. In one embodiment, the lower die contains a logic circuit, for example, a processor core or a system on a chip. The upper die may contain a memory structure, for example, a DRAM. In an alternate embodiment, the logic circuit is on the upper die and the memory module is on the lower die.

Temperature information from two or more thermal sensors is collected on the logic die, 310. The logic die may have any number of thermal sensors and, one or more circuits on the logic die may manage operation of the logic die by utilizing the temperature information collected from the multiple thermal sensors.

Temperature difference information is determined for at least one pair of thermal sensors on the logic die, 320. In one embodiment, at least one of the thermal sensors for which a temperature difference is determined is aligned with a corresponding thermal sensor on the memory module die.

The temperature difference information is transmitted between the logic die and the memory die, 330. In one embodiment, the temperature difference may be communicated by one or more bits that indicate temperature differential ranges, or a number indicating an actual temperature difference may be transmitted. For example, in a single-bit embodiment, a 0 may indicate a temperature difference in a first range (e.g., 0-5 degrees, 0-10 degrees, 0-12 degrees) and a 1 may indicate a temperature difference in a second range (e.g., >5 degrees, >10 degrees, >12 degrees).

In a two-bit embodiment, four ranges may be supported. For example, a 00 may indicate a first range (e.g., 0-5 degrees, 0-7 degrees, 0-10 degrees), a 01 may indicate a second range (e.g., 6-10 degrees, 8-15 degrees, 11-20 degrees), a 10 may indicate a third range (e.g., 11-15 degrees, 16-20 degrees, 21-25 degrees), and a 11 may indicate a fourth range (e.g., >15 degrees, >20 degrees, >25 degrees). Other embodiments with different numbers of bits may be similarly supported.

Temperature information is gathered for the memory module, 340. In one embodiment, the memory module has only one thermal sensor that is aligned with one of the thermal sensors of the logic die. In alternate embodiments, the memory module may have multiple thermal sensors. The memory module may have management (or other control) circuitry that utilizes temperature information to manage operation of the memory module. In one embodiment, the refresh rate for the memory array is determined based, at least in part, on the operating temperature of the memory module.

The management circuitry utilizes the temperature information from the memory module thermal sensor and the temperature difference information to adjust, if necessary, the operational parameters of the memory module, 350. In one embodiment, the refresh rate of the memory module may be determined based on the measured temperature as adjusted by the temperature difference information. Other operational parameters may also be adjusted.

In alternate embodiments, other adjustments may be made utilizing the temperature difference information. For example, if two logic dice are stacked and the respective thermal sensors are not aligned, temperature difference information may be shared between the dice, which will allow the respective control circuits to have more accurate information upon which to base operational parameters.

Figure 4:
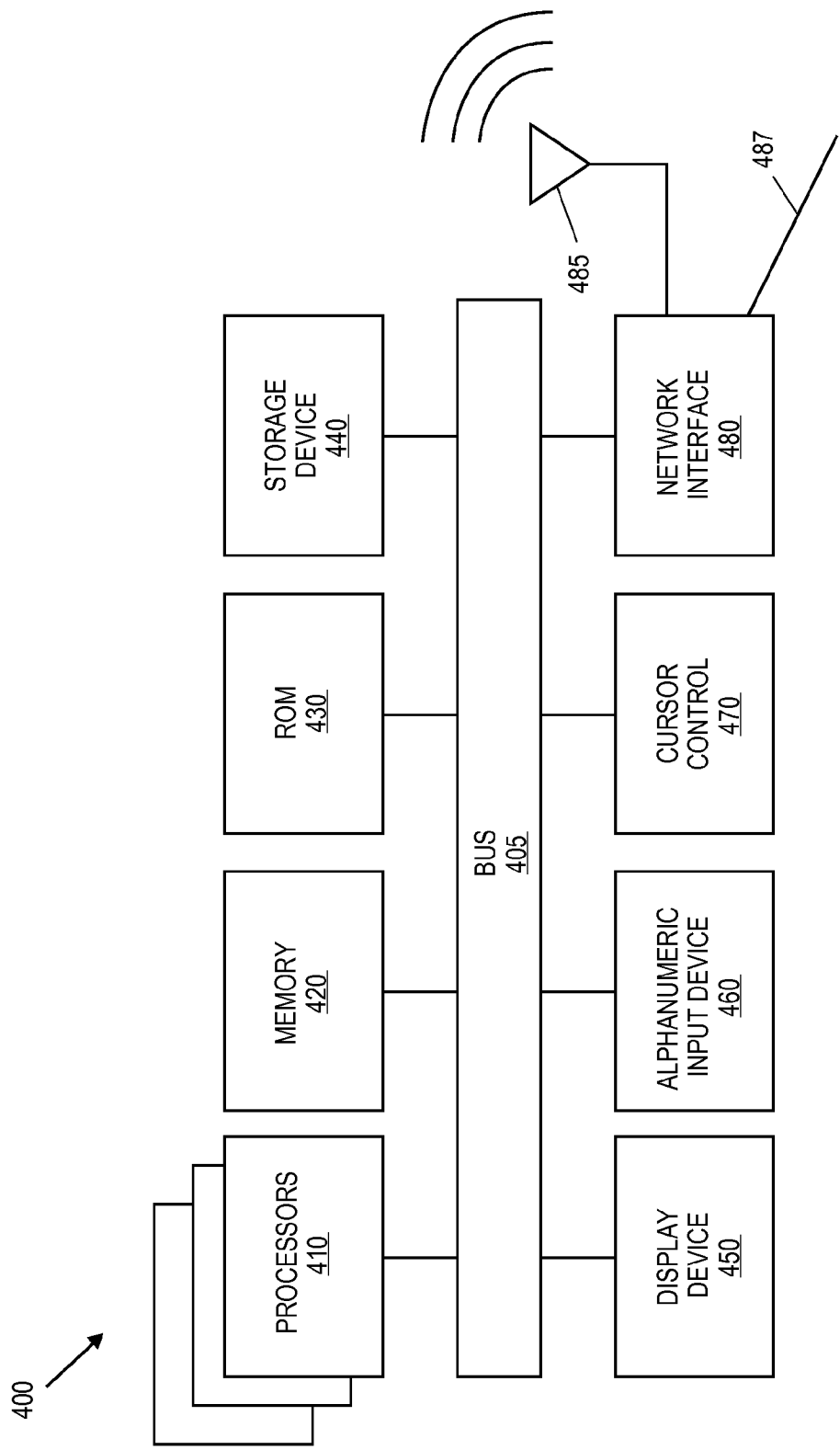
FIG. 4 is a block diagram of one embodiment of an electronic system.

FIG. 4 is a block diagram of one embodiment of an electronic system. The electronic system illustrated in FIG. 4 is intended to represent a range of electronic systems (either wired or wireless) including, for example, desktop computer systems, laptop computer systems, cellular telephones, personal digital assistants (PDAs) including cellular-enabled PDAs, set top boxes. Alternative electronic systems may include more, fewer and/or different components.

One or more of the components illustrated in FIG. 4 may be on dice that are in physical contact as described above. For example, one or more of processors 410 and one or more DRAM modules that are part of memory 420 may be arranged as described above. Other components may be similarly arranged.

Electronic system 400 includes bus 405 or other communication device to communicate information, and processor 410 coupled to bus 405 that may process information. While electronic system 400 is illustrated with a single processor, electronic system 400 may include multiple processors and/or co-processors. Electronic system 400 further may include random access memory (RAM) or other dynamic storage device 420 (referred to as main memory), coupled to bus 405 and may store information and instructions that may be executed by processor 410. Main memory 420 may also be used to store temporary variables or other intermediate information during execution of instructions by processor 410.

Electronic system 400 may also include read only memory (ROM) and/or other static storage device 430 coupled to bus 405 that may store static information and instructions for processor 410. Data storage device 440 may be coupled to bus 405 to store information and instructions. Data storage device 440 such as a magnetic disk or optical disc and corresponding drive may be coupled to electronic system 400.

Electronic system 400 may also be coupled via bus 405 to display device 450, such as a cathode ray tube (CRT) or liquid crystal display (LCD), to display information to a user. Alphanumeric input device 460, including alphanumeric and other keys, may be coupled to bus 405 to communicate information and command selections to processor 410. Another type of user input device is cursor control 470, such as a mouse, a trackball, or cursor direction keys to communicate direction information and command selections to processor 410 and to control cursor movement on display 450.

Electronic system 400 further may include network interface(s) 480 to provide access to a network, such as a local area network. Network interface(s) 480 may include, for example, a wireless network interface having antenna 485, which may represent one or more antenna(e). Network interface(s) 480 may also include, for example, a wired network interface to communicate with remote devices via network cable 487, which may be, for example, an Ethernet cable, a coaxial cable, a fiber optic cable, a serial cable, or a parallel cable.

In one embodiment, network interface(s) 480 may provide access to a local area network, for example, by conforming to IEEE 802.11b and/or IEEE 802.11g standards, and/or the wireless network interface may provide access to a personal area network, for example, by conforming to Bluetooth standards. Other wireless network interfaces and/or protocols can also be supported.

IEEE 802.11b corresponds to IEEE Std. 802.11b-1999 entitled "Local and Metropolitan Area Networks, Part 11: Wireless LAN Medium Access Control (MAC) and Physical Layer (PHY) Specifications: Higher-Speed Physical Layer Extension in the 2.4 GHz Band," approved Sep. 16, 1999 as well as related documents. IEEE 802.11g corresponds to IEEE Std. 802.11g-2003 entitled "Local and Metropolitan Area Networks, Part 11: Wireless LAN Medium Access Control (MAC) and Physical Layer (PHY) Specifications, Amendment 4: Further Higher Rate Extension in the 2.4 GHz Band," approved Jun. 27, 2003 as well as related documents. Bluetooth protocols are described in "Specification of the Bluetooth System: Core, Version 1.1," published Feb. 22, 2001 by the Bluetooth Special Interest Group, Inc. Associated as well as previous or subsequent versions of the Bluetooth standard may also be supported.

In addition to, or instead of, communication via wireless LAN standards, network interface(s) 480 may provide wireless communications using, for example, Time Division, Multiple Access (TDMA) protocols, Global System for Mobile Communications (GSM) protocols, Code Division, Multiple Access (CDMA) protocols, and/or any other type of wireless communications protocol.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

While the invention has been described in terms of several embodiments, those skilled in the art will recognize that the invention is not limited to the embodiments described, but can be practiced with modification and alteration within the spirit and scope of the appended claims. The description is thus to be regarded as illustrative instead of limiting.

What is claimed is:

1. An apparatus comprising:
  a first die having a thermal sensor;
  a second die stacked with the first die, the second die having a first thermal sensor and a second thermal sensor, the second die in close physical proximity with the first die and the thermal sensor of the first die aligned with the first thermal sensor of the second die, the second thermal sensor of the second die located at a hot spot of the second die, wherein the thermal sensor of the first die does not align with the second thermal sensor of the second die;
  a control circuit coupled with the first thermal sensor on the second die and the second thermal sensor on the second die, the control circuit to determine a temperature difference between the first thermal sensor on the second die and the second thermal sensor on the second die;
  management logic coupled with the control circuit and the thermal sensor on the first die, the management logic to receive a first value, based on the temperature difference, the first value to indicate a temperature differential range of a plurality of pre-defined temperature differential ranges, and the management logic to further receive a temperature measurement from the thermal sensor on the first die and to determine, based on the first value, an adjustment to the temperature measurement from the thermal sensor on the first die, and to further manage self-refresh parameters of the first die based on the adjustment to the temperature measurement.

2. The apparatus of claim 1 wherein the first die comprises a dynamic random access memory (DRAM) array.

3. The apparatus of claim 2 wherein the management logic modifies refresh rates of the DRAM array based on the temperature gradient on the second die and the temperature measurement from the thermal sensor on the first die.

4. The apparatus of claim 2 wherein the second die comprises a processor core.

5. The apparatus of claim 2 wherein the second die comprises a system on a chip (SoC).

6. A system comprising:
wireless transceiver circuitry coupled with an antenna;
a first die having a thermal sensor;
a second die stacked with the first die, the second die having a first thermal sensor and a second thermal sensor, the second die in close physical proximity with the first die and the thermal sensor of the first die aligned with the first thermal sensor of the second die, the second thermal sensor of the second die located at a hot spot of the second die, wherein the thermal sensor of the first die does not align with the second thermal sensor of the second die;
a control circuit coupled with the first thermal sensor on the second die and the second thermal sensor on the second die, the control circuit to determine a temperature difference between the first thermal sensor on the second die and the second thermal sensor on the second die;
management logic coupled with the control circuit and the thermal sensor on the first die, the management logic to receive a first value, based on the temperature difference, the first value to indicate a temperature differential range of a plurality of pre-defined temperature differential ranges, and the management logic to further receive a temperature measurement from the thermal sensor on the first die and to determine, based on the first value, an adjustment to the temperature measurement from the thermal sensor on the first die, and to further manage self-refresh parameters of the first die based on the adjustment to the temperature measurement.

7. The system of claim 6 wherein the first die comprises a dynamic random access memory (DRAM) array.

8. The system of claim 7 wherein the management logic modifies refresh rates of the DRAM array based on the temperature difference and the temperature measurement from the thermal sensor on the first die.

9. The system of claim 7 wherein the second die comprises a processor core.

10. The system of claim 7 wherein the second die comprises a system on a chip (SoC).

11. A method comprising:
determining a temperature difference between a first thermal sensor and a second thermal sensor on a first die;
transmitting a first value, based on the temperature difference from the first die to a circuit on a second die, the first value indicating a temperature differential range of a plurality of pre-defined temperature differential ranges, the second die stacked with the first die with a thermal sensor of the second die aligned with the first thermal sensor of the first die, the second thermal sensor of the first die located at a hot spot of the first die, wherein the thermal sensor of the second die does not align with the second thermal sensor of the first die;
determining a temperature measurement from a thermal sensor located on the second die;
determining, based on the first value, an adjustment to the temperature measurement from the thermal sensor on the second die; and
based on the adjustment to the temperature measurement, modifying self-refresh parameters of one or more memory circuits on the second die.

12. The method of claim 11 wherein the second die comprises a dynamic random access memory (DRAM) array.

13. The method of claim 12 wherein the circuit modifies refresh rates of the DRAM array based on the temperature measurement from the thermal sensor on the second die.

14. The method of claim 12 wherein the first die comprises a processor core.

15. The method of claim 12 wherein the second die comprises a system on a chip (SoC).

* * * * *